(12) United States Patent
Li et al.

(10) Patent No.: US 8,022,758 B2
(45) Date of Patent: Sep. 20, 2011

(54) IMPEDANCE MATCHING CIRCUIT AND METHOD THEREOF

(75) Inventors: Hsin-Hsien Li, Hsin Chu (TW);
Chin-Chun Lin, Hsin Chu (TW);
Tsung-Hsien Hsieh, Hsin Chu (TW);
Zi-Long Huang, Hsin Chu (TW)

(73) Assignee: Ralink Technology Corp., Jhubei (TW)

( * ) Notice: Subject to any disclaimer, the term of this patent is extended or adjusted under 35 U.S.C. 154(b) by 4 days.

(21) Appl. No.: 12/683,386

(22) Filed: Jan. 6, 2010

(65) Prior Publication Data
US 2011/0163807 A1  Jul. 7, 2011

(51) Int. Cl.
*H03F 1/36* (2006.01)
(52) U.S. Cl. .......................................... 330/86; 330/254
(58) Field of Classification Search .................... 330/86, 330/254, 69, 260
See application file for complete search history.

(56) References Cited

U.S. PATENT DOCUMENTS

| | | | | |
|---|---|---|---|---|
| 4,354,159 A | * | 10/1982 | Schorr et al. | 330/86 |
| 7,368,987 B2 | * | 5/2008 | Blon | 330/86 |
| 7,423,482 B2 | * | 9/2008 | Blon | 330/86 |

* cited by examiner

*Primary Examiner* — Henry K Choe
(74) *Attorney, Agent, or Firm* — Alston & Bird LLP

(57) ABSTRACT

A circuit comprises an amplifier circuit and a trimming circuit. The amplifier circuit includes an operational amplifier. The operational amplifier has a first input configured to receive input signals, and the operational amplifier also has a second input and an amplifier output. One of the first input or the second input is a negative input. The trimming circuit is coupled to the amplifier output. The trimming circuit includes a termination resistor coupled in parallel with at least one trimming resistor. The termination resistor is coupled to a first switch in series, and the trimming resistor is coupled to a second switch in series. The amplifier output is connected back to the negative input through the first switch.

18 Claims, 5 Drawing Sheets

IMPEDANCE MATCHING CIRCUIT AND METHOD THEREOF

TECHNICAL FIELD

Exemplary embodiments of the present invention relate to a semiconductor product and method thereof, and more particularly, to a trimming circuit in a communications system.

BACKGROUND

Semiconductor devices implemented by integrated circuits are widely used for various electronic applications or communications systems. In the transmission of information or data via electrical signals, transmitting as much of the power as possible from power source to load is often desirable. However, undesired variations in behavior of semiconductor devices resulting from manufacturing processes may result in impedance mismatches, which may cause large power consumption and limit the accuracy of the circuit behavior. Accordingly, it is typically desirable to reduce the impact of impedance mismatches on the performance of circuits and to maximize the power transfer. There are a variety of techniques to reduce the impact of impedance mismatches. Among them, impedance matching is the most commonly used technique. Impedance matching may involve attempts to make an output impedance of a source, such as a power amplifier (PA) of a communications system, and an input impedance of a load, such as an antenna or a wired communications medium, attain a desired relationship so that maximum power transfer, maximum voltage transfer, maximum efficiency, minimum signal reflections, and so forth, are achieved.

There are various devices, for example, termination resistors, transformers, inductors and capacitors or combination of them, that may be used between power source and load that perform impedance matching. In many conventional impedance matching circuits, termination resistors may reside outside the semiconductor device or may be integrated into the circuit boards to lower the cost. In the later example, a trimming circuit is by far the most common technique to more precisely match source impedance to load impedance.

FIG. 1 is a schematic diagram of a conventional impedance matching circuit 100 utilizing a trimming circuit. As is shown, the circuit 100 includes an amplifier circuit 102 and a trimming circuit 104. The trimming circuit 104 includes a termination resistor $R_{S0}$ and a plurality of trimming resistors $R_{S1}$, $R_{S2}$ ... $R_{SN}$ in parallel. The trimming resistors are coupled to respective metal-oxide-semiconductor (MOS) transistors $S_1$, $S_2$, ... $S_N$ used as switches in series. For example, the trimming resistor $R_{SN}$ is coupled to the MOS transistor $S_N$ in series. Because the inherent nonlinear characteristics of the MOS transistors are not included in the negative feedback circuit, the MOS transistors may transfer the nonlinearities through the trimming resistors to the load, and hence cause distortions of the input signals which may degrade the linearity of the output signal Vout.

BRIEF SUMMARY

According to one exemplary embodiment of the invention, a circuit for correcting the linearity of the output signal comprises an amplifier circuit and a trimming circuit coupled to the amplifier output. The amplifier circuit includes an operational amplifier. The operational amplifier has a first input configured to receive input signals, and a second input and an amplifier output. One of the first input or the second input is a negative input. The trimming circuit includes a termination resistor coupled in parallel with at least one trimming resistor. The termination resistor is coupled to a first switch in series, and the trimming resistor is coupled to a second switch in series. The amplifier output is connected back to the negative input through the first switch.

According to one exemplary embodiment of the invention, a circuit for correcting the linearity of the output signal comprises an amplifier circuit and a trimming circuit coupled to the amplifier output. The amplifier circuit includes an operational amplifier. The operational amplifier has a first input configured to receive input signals, and a second input and an amplifier output. One of the first input or the second input is a negative input. The trimming circuit includes a termination resistor coupled in parallel with at least one trimming resistor. The termination resistor is coupled to a first switch in series, and the trimming resistor is coupled to a second switch in series, such that a ratio of a resistance of the first switch to a resistance of the second switch approximately equals a ratio of a resistance of the termination resistor to a resistance of the trimming resistor.

According to one exemplary embodiment of the invention, a method for correcting the linearity of the output signal comprises providing an operational amplifier, the operational amplifier having a first input configured to receive input signals, and the operational amplifier also having a second input and an amplifier output. One of the first input or the second input is a negative input. The method further comprises providing a trimming circuit coupled to the amplifier output. The trimming circuit includes a termination resistor coupled in parallel with at least one trimming resistor. The method further comprises providing a first switch coupled to the termination resistor in series, and a second switch coupled to the at least one trimming resistor in series, such that a ratio of a resistance of the first switch to a resistance of the second switch approximately equals a ratio of a resistance of the termination resistor to a resistance of the trimming resistor. The amplifier output is connected back to the negative input through the first switch.

BRIEF DESCRIPTION OF THE DRAWINGS

The embodiments illustrated in the figures of the accompanying drawings herein are by way of example and not by way of limitation. In the drawings.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Terms such as "substantially," "about," "nearly," "approximately" or the like as used in referring to a relationship between two objects or values are intended to reflect not only an exact relationship but also variances in that relationship that may be due to various factors such as common or accepted error tolerances, variations or the like. It should further be understood that although some values or other relationships may be expressed herein without a modifier, these values or other relationships may also be exact or may include a degree of variation due to various factors such as common or accepted error tolerances, risk tolerances, variations or the like.

Figure 1:
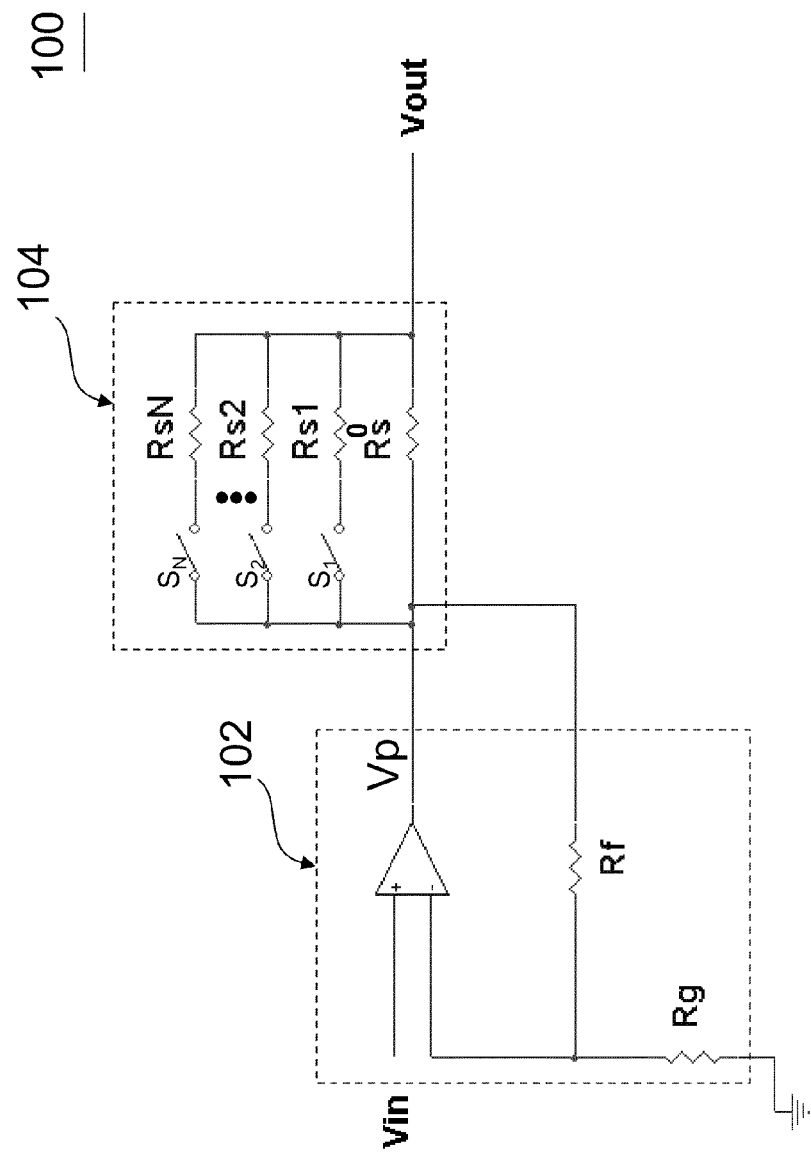
FIG. 1 is a circuit diagram of a conventional circuit having a trimming circuit.
Figure 2A:
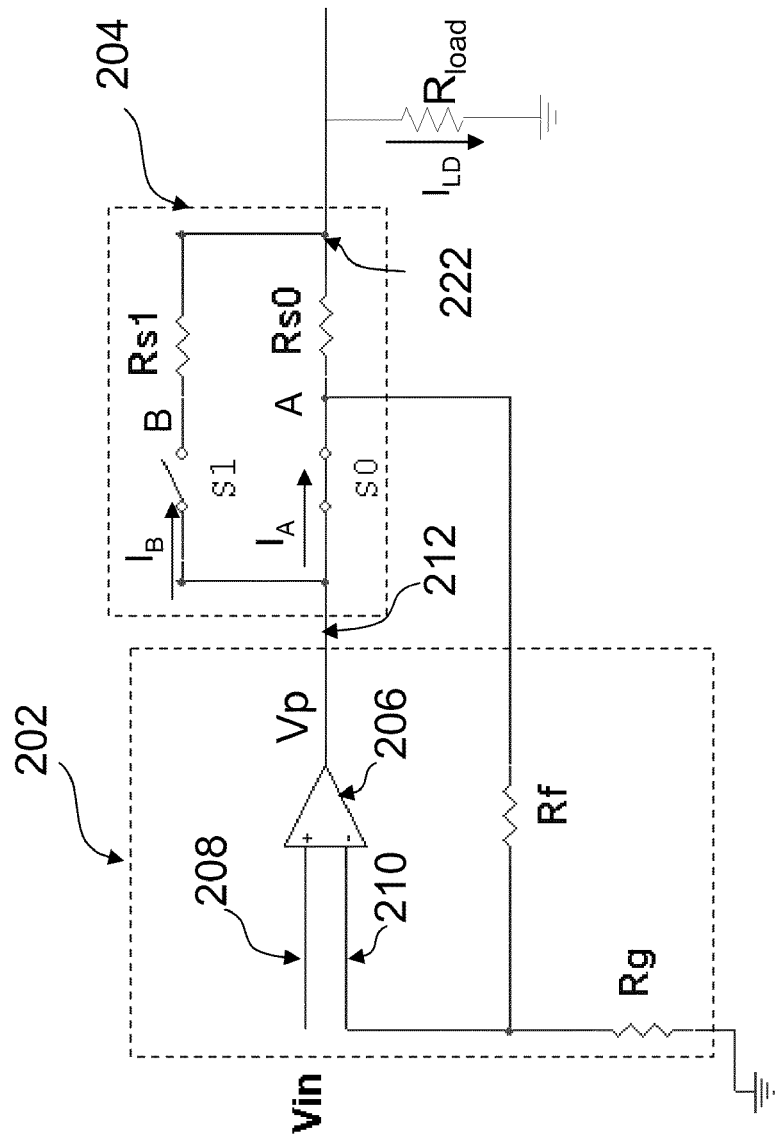
FIG. 2A is a circuit diagram according one exemplary embodiment of the present invention.
Figure 2B:
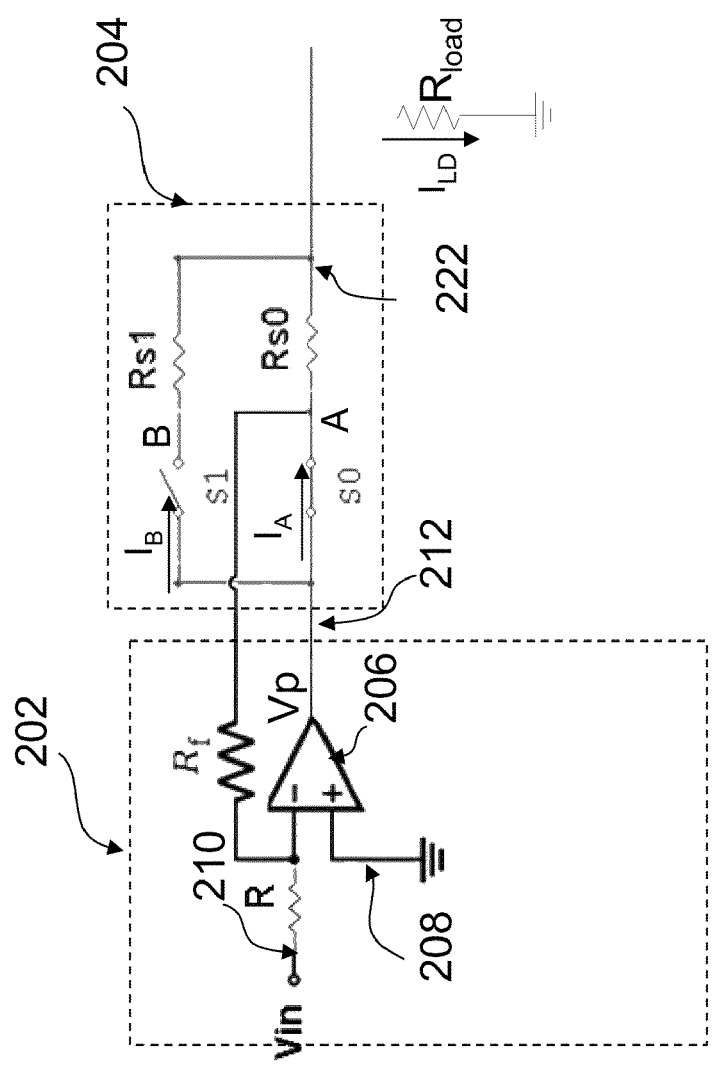
FIG. 2B is a circuit diagram according one exemplary embodiment of the present invention.

FIG. 2A is a circuit diagram according to one exemplary embodiment of the present invention ("exemplary" as used herein referring to "serving as an example, instance or illustration"). Referring to FIG. 2A, a circuit 200 comprises an amplifier circuit 202 and a trimming circuit 204. The amplifier circuit 202 includes an operational amplifier 206 having a first (e.g., positive) input 208 for receiving input signals, a second (e.g., negative) input 210 and an amplifier output 212. The input signals can be either voltage source or current source. In this exemplary embodiment, the first input 208 is coupled to a voltage source $V_{in}$. The output of the operational amplifier 206 is also in the form of a voltage $V_p$. The trimming circuit 204 is coupled between the amplifier output 212 and a load impedance $R_{load}$. The operational amplifier 206 may be a non-inverting operational amplifier, an inverting operational amplifier or other circuits comprising two inputs and one output where one input is configured to receive the input signals and the output is coupled back to one of the two inputs. In the exemplary embodiment as shown in FIG. 2A, the operational amplifier 206 is a non-inverting operational amplifier where the input signal is a positive signal received by the first input 208. In another exemplary embodiment with reference to FIG. 2B, the operational amplifier 206 is an inverting operational amplifier where the input signal is received by the second input 210. The amplifier output 212 is coupled to the negative input which is the second input 210 as shown in FIG. 2A and FIG. 2B. The description below describes the operation of circuit illustrated in FIG. 2A. The circuit in FIG. 2B operates in a similar way in terms of correcting the linearity of the output signals Vout.

As shown in FIG. 2A, the trimming circuit 204 includes a termination resistor $R_{S0}$ coupled in parallel with at least one trimming resistor, for example, a trimming resistor $R_{S1}$. The termination resistor $R_{S0}$ is coupled to a first switch $S_0$ in series. The trimming resistor $R_{S1}$ is coupled to a second switch $S_1$ in series. More generally, if there are a plurality of trimming resistors $R_{S1}, R_{S2} \ldots R_{SN}$ coupled in parallel between the amplifier output 212 and the load impedance $R_{load}$, each trimming resistor may be coupled in series to a respective second switch. For example, trimming resistors $R_{S1}, R_{S2} \ldots R_{SN}$ may be coupled in series to respective second switches $S_1, S_2 \ldots S_N$.

The amplifier output 212 is connected back to the negative input 210 through the first switch $S_0$ and a feedback circuit (not numbered). As shown, the feedback circuit may be formed by a feedback resistor $R_f$ and an input resistor $R_g$. One end of the feedback resistor $R_f$ is coupled to a terminal of the first switch $S_0$ opposite the terminal of the first switch $S_0$ to which the amplifier output 212 is coupled. The other end of the feedback resistor $R_f$ is coupled to the negative input 210 of the amplifier 206. The negative input 210 is also coupled to virtual ground through the input resistor $R_g$.

In an exemplary embodiment, the first switch $S_0$ may be the same type as the second switches $S_1, S_2 \ldots S_N$. For example, both of the first switch $S_0$ and the second switch $S_1$ may be voltage-controlled switches. More specifically, the first switch $S_0$ and the second switch $S_1$ may be MOS transistors, which consist of three terminals, namely a source, drain and gate. In another exemplary embodiment, each of the first switch $S_0$ and the second switch $S_1$ may be a transmission gate comprising a pair of complementary MOS transistors. Operation modes of MOS transistors depend on the terminal voltages $V_S$, $V_D$, and $V_G$ at the source, drain and gate, respectively. When gate-to-source voltage $V_{GS}$ is greater than threshold voltage $V_T$, a channel may be formed between the source and the drain. When the channel is pinched off near the drain, i.e., $V_{GS} > (V_{GS} - V_T)$, the MOS transistor may be completely or near-completely conducted, and the current $I_{DS}$ flowing in the channel may be saturate or near saturate. The saturate current $I_{DS}$ may be calculated with the I-V characteristics formula:

$$\frac{1}{2}\mu C_{ox}\left(\frac{W}{L}\right)(V_{GS} - V_T)^2,$$

where $\mu$ is the mobility, $C_{ox}$ is the capacitance per unit area of the gate, and W and L are the width and length of the channel. The I-V characteristics curves of a MOS transistor according to one exemplary embodiment are shown in FIG. 3.

Figure 3:
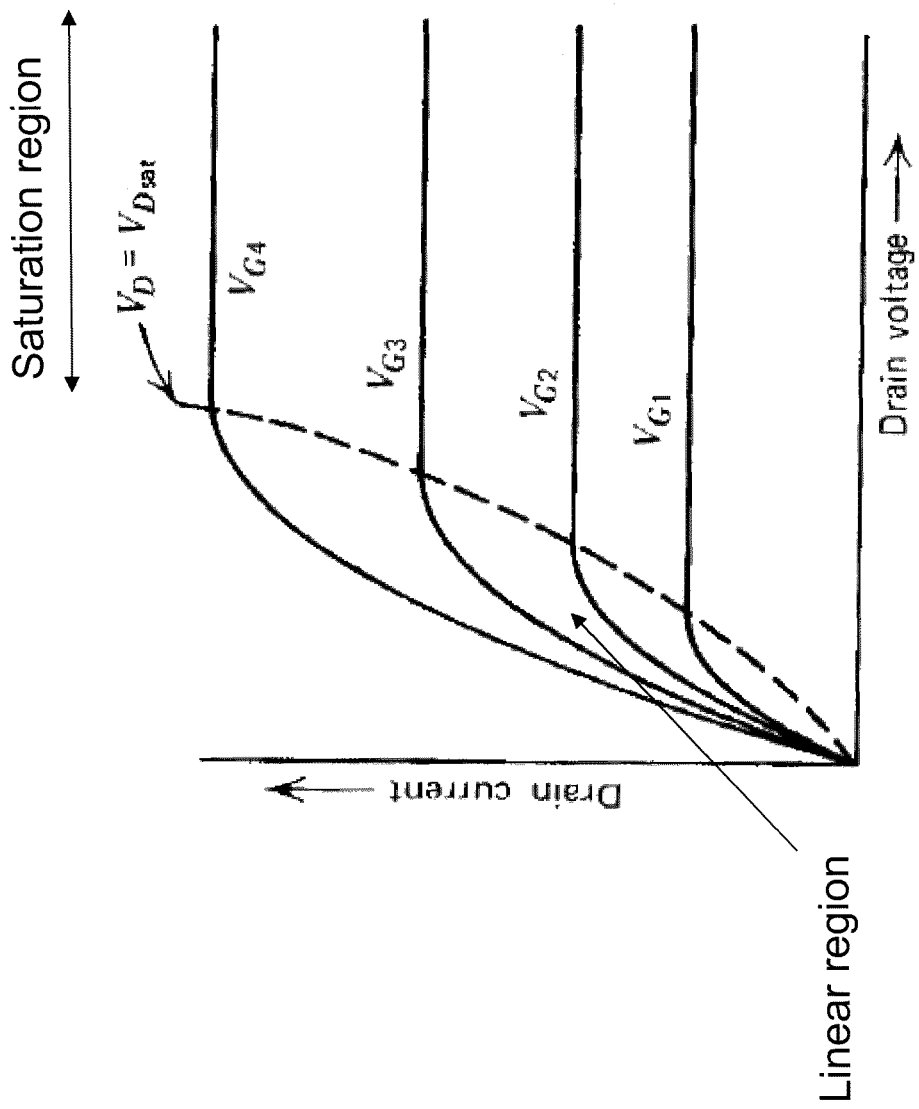
FIG. 3 is I-V characteristics curves of a MOS transistor.

The I-V characteristics equation and FIG. 3 show that switches exhibit a variation in the nonlinearity resulting from device imperfections and variances of the fabrication process. To cancel or reduce the nonlinearities of the switches which may cause mismatches in the currents, referring back to FIG. 2A, the sizes of the first switch $S_0$ and the second switch $S_1$ may be pre-determined in accordance with the following:

$$\frac{W_0/L}{W_1/L} = \frac{R_{S1}}{R_{S0}}.$$

As the result, the on-resistance $R_{on\_S0}$ of the first switch $S_0$ and the on-resistance $R_{on\_S1}$ of the second switch $S_1$ may be represented by:

$$\frac{R_{on\_S1}}{R_{on\_S0}} = \frac{R_{S1}}{R_{S0}}.$$

If a variable c is defined as $$\frac{R_{on\_S1}}{R_{on\_S0}} = \frac{R_{S1}}{R_{S0}} = c,$$

the following relationships may be obtained: $R_{on\_S1} = c \cdot R_{on\_S0}$ and $R_{S1} = c \cdot R_{S0}$.

In addition to the foregoing, a voltage $V_A$ at node A can be calculated as a function of the on-resistance of the first switch as follows:

$$V_A = \left(\frac{R_{S0}}{R_{on\_S0} + R_{S0}}\right) \cdot V_p + \left(\frac{R_{on\_S0}}{R_{on\_S0} + R_{S0}}\right) \cdot V_{outp} \quad \text{Equation (1)}$$

where $V_p$ is the output voltage of the operational amplifier 206 and $V_{outp}$ is the voltage at a node 222. In a similar manner, voltage $V_B$ at node B can be calculated as follows:

$$V_B = \left(\frac{R_{S1}}{R_{on\_S1} + R_{S1}}\right) \cdot V_p + \left(\frac{R_{on\_S1}}{R_{on\_S1} + R_{S1}}\right) \cdot V_{outp} \quad \text{Equation (2)}$$

Then, by replacing $R_{S1}$ with $c \cdot R_{S0}$ and $R_{on\_S1}$ with $c \cdot R_{on\_S0}$ in equation (2), the following may be obtained:

$$V_B = \left(\frac{c \cdot R_{s0}}{c \cdot R_{on0} + c \cdot R_{s0}}\right) \cdot V_p + \left(\frac{c \cdot R_{on0}}{c \cdot R_{on0} + R_{s0}}\right) \cdot V_{outp} =$$

$$\left(\frac{R_{S0}}{R_{on0} + R_{S0}}\right) \cdot V_p + \left(\frac{R_{on0}}{R_{on0} + R_{S0}}\right) \cdot V_{outp} = V_A$$

As derived above, in operation, voltage $V_A$ at the node A may equal or approximately equal voltage $V_B$ at the node B. Because negative feedback may improve the linearity of amplifiers, mismatch effects on the trimming circuit 204 caused by the nonlinearity of the first switch $S_0$ may be reduced or eliminated by connecting the amplifier output 212 back to the negative input 210 through the first switch $S_0$. As the result, a current $I_A$ flowing through the termination resistor $R_{S0}$ may be approximately a linear current. $V_A$ at the node A may be therefore viewed as a linear voltage. In addition, because $V_A$ may equal $V_B$, the second switch $S_1$ may be considered as a part of the feedback circuit, the effect on the trimming circuit 202 caused by the nonlinearity of the second switch $S_1$ may be accordingly canceled. $V_B$ at node B may also be viewed as a linear voltage, and a current $I_B$ flowing through the trimming resistor $R_{S1}$ may be a linear current. Thus, the total resistance of the trimming circuit 204 may equal or approximately equal to $R_{S0}//R_{S1}$ and may not be affected by the nonlinearities of the first switch $S_0$ and the second switch $S_1$. Current $I_{LD}$ following through the load impedance $R_{load}$ may be approximately the sum of the current $I_A$ and the current $I_B$, which may be a linear current in the same manner as $I_A$ and $I_B$. Likewise, the voltage across the load impedance $R_{load}$ may be a linear voltage.

Figure 4:
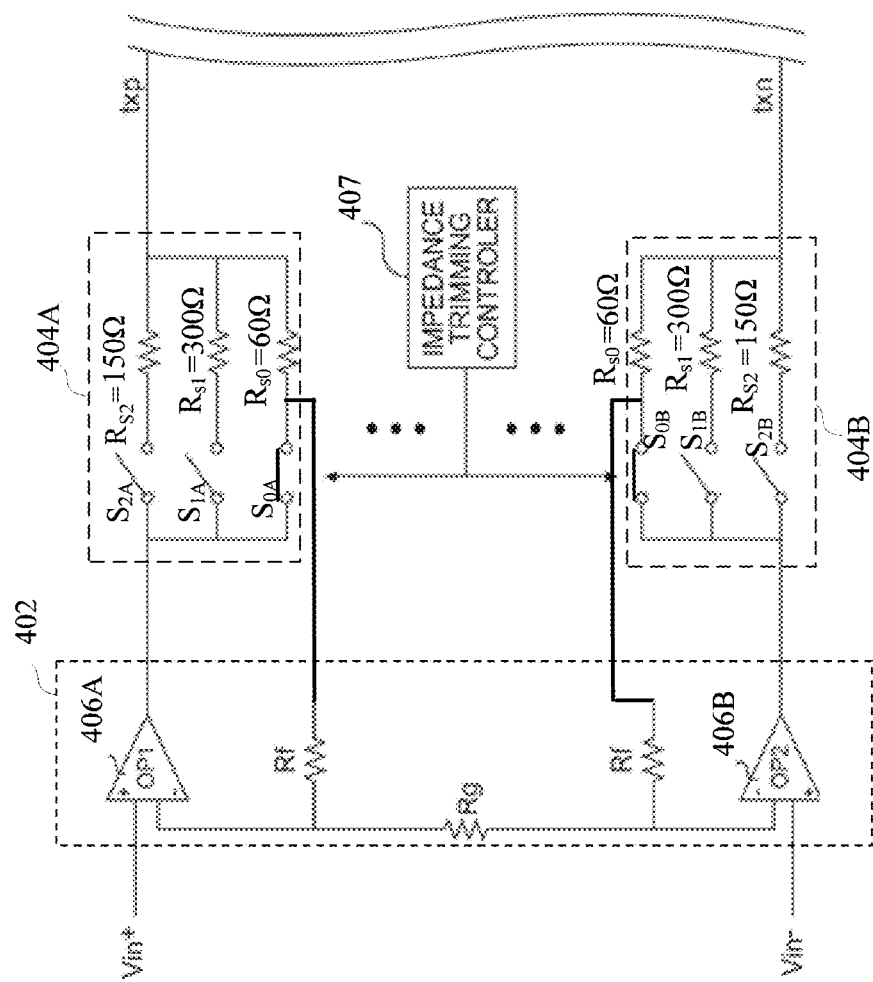
FIG. 4 is a circuit diagram according to one exemplary embodiment of the present invention as implemented in an Ethernet system.

FIG. 4 is a circuit diagram according to one exemplary embodiment of the present invention as implemented in an Ethernet system. Referring to FIG. 4, a circuit 400 comprises an amplifier circuit 402 including two operational amplifiers 406A and 406B. The amplifier circuit 402 can provide either voltage source or current source. In this exemplary embodiment, the positive input of each of the operational amplifiers 406A and 406B is coupled to a voltage source $V_{in}$. Negative inputs of the two operational amplifiers 406A and 406B are connected via an input resistor $R_g$. The circuit 400 further comprises a first trimming circuit 404A coupled between the output of the operational amplifier 406A and a first terminal (shown as "txp") of a load impedance (not numbered), and a second trimming circuit 404B coupled between the output of the operational amplifier 406B and a second, different terminal (shown as "txn") of the load impedance. In other words, the first trimming circuit 404A is in parallel with the second trimming circuit 404B. Each of the trimming circuits 404A and 404B includes a termination resistor $R_{S0}$ coupled in parallel with at least one trimming resistor. In this exemplary embodiment, each trimming circuit includes two trimming resistors, $R_{S1}$ and $R_{S2}$. Each termination resistor $R_{S0}$ is coupled to a respective first switch $S_0$ ($S_{0A}$, $S_{0B}$) in series, and each trimming resistor is coupled to a respective second switch in series. For example, the trimming resistor $R_{S1}$ is coupled to the second switch $S_1$ ($S_{1A}$, $S_{1B}$) in series, and the trimming resistor $R_{s2}$ is coupled to the second switch $S_2$ ($S_{2A}$, $S_{2B}$) in series. The circuit 400 further comprises an impedance trimming controller 407 to control ON or OFF of the second switches $S_1$ and $S_2$, which are coupled to the respective trimming resistors in series.

In operation, the first switches $S_0$ coupled in series to the termination resistors $R_{s0}$ may be kept in a conducting state. To reduce or eliminate the nonlinearities caused by the second switches $S_1$, for example, the output of the operational amplifier 406A may be connected back to its negative input through the first switch $S_{0A}$. Depending on the impedance required by the system, the impedance trimming controller 407 may be configured to change the status of the second switches $S_1$ to implement the impedance requirement. For example, if a 50Ω impedance is required by the system, the second switch $S_{1A}$ of the trimming circuit 404A may be turned on. As the result, the total resistance of the trimming circuit 404A may be $$\frac{1}{1/300\Omega + 1/60\Omega},$$

or 50Ω.

Exemplary embodiments of the present invention also include a method for reducing impedance mismatches in a communications system. In one exemplary embodiment, the method may be implemented in an Ethernet system. The method may include providing an operational amplifier having a positive input configured to receive input signals, and that also has a negative input and an amplifier output. The method may further include providing a trimming circuit coupled to the amplifier output. The trimming circuit includes a termination resistor coupled in parallel with at least one trimming resistor. The method may also provide a first switch coupled to the termination resistor in series and a second switch coupled to the trimming resistor such that a ratio of the first switch resistance to the second switch resistance approximately equals a ratio of the termination resistor resistance to the trimming resistor resistance. The amplifier output may be connected back to the negative input through the first switch.

It will be appreciated by those skilled in the art that changes could be made to the examples described above without departing from the broad inventive concept. It is understood, therefore, that this invention is not limited to the particular examples disclosed, but it is intended to cover modifications within the spirit and scope of the present invention as defined by the appended claims. Although specific terms are employed herein, they are used in a generic and descriptive sense only and not for purposes of limitation.

What is claimed is:

1. A circuit comprising:
   an amplifier circuit including an operational amplifier, the operational amplifier having a first input configured to receive input signals, and the operational amplifier also having a second input and an amplifier output, wherein one of the first input or the second input is a negative input; and
   a trimming circuit coupled to the amplifier output, the trimming circuit including a termination resistor coupled in parallel with at least one trimming resistor, wherein the termination resistor is coupled to a first switch in series, and the at least one trimming resistor is coupled to a second switch in series, wherein the amplifier output is connected back to the negative input through the first switch, wherein the first switch includes two ends, one end connected to the amplifier output, and another end connected to a feedback circuit, and wherein the first switch is always in a conducting state.

2. The circuit of claim 1, wherein the first switch comprises at last one metal-oxide-semiconductor transistor.

3. The circuit of claim 1, wherein the first switch comprises at least one voltage-controlled switch.

4. The circuit of claim 1, wherein the first switch comprises a transmission gate.

5. The circuit of claim 1, wherein a ratio of a resistance of the first switch to a resistance of the second switch approximately equals a ratio of a resistance of the termination resistor to a resistance of the trimming resistor.

6. The circuit of claim 1, wherein a total resistance of the trimming circuit approximately equals a parallel resistance of the termination resistor and the trimming resistor.

7. The circuit of claim 1, wherein the first switch and the second switch comprises the same type of switch.

8. A circuit comprising:
- an amplifier circuit including an operational amplifier, the operational amplifier having a first input configured to receive input signals, and the operational amplifier also having a second input and an amplifier output, wherein one of the first input or the second input is a negative input; and
- a trimming circuit coupled to the amplifier output, the trimming circuit including a termination resistor coupled in parallel with at least one trimming resistor, wherein the termination resistor is coupled to a first switch in series, and the at least one trimming resistor is coupled to a second switch in series, such that a ratio of a resistance of the first switch to a resistance of the second switch approximately equals a ratio of a resistance of the termination resistor to a resistance of the trimming resistor,
- wherein the first switch includes two ends, one end connected to the amplifier output, and another end connected to a feedback circuit, and wherein the first switch is always in a conducting state.

9. The circuit of claim 8, wherein the first switch comprises at least one metal-oxide-semiconductor transistor.

10. The circuit of claim 8, wherein the first switch comprises at least one voltage-controlled switch.

11. The circuit of claim 8, wherein the first switch comprises a transmission gate.

12. The circuit of claim 8, wherein the circuit is configured to keep the first switch in a conducting state.

13. The circuit of claim 8, wherein a total resistance of the trimming circuit approximately equals a parallel resistance of the termination resistor and the trimming resistor.

14. The circuit of claim 8, wherein the amplifier output is connected back to the negative input through the first switch and a feedback circuit.

15. The circuit of claim 8, wherein the first switch and the second switch comprises the same type of switch.

16. A method comprising:
- providing an operational amplifier, the operational amplifier having a first input configured to receive input signals, and the operational amplifier also having a second input and an amplifier output, wherein one of the first input or the second input is a negative input;
- providing a trimming circuit coupled to the amplifier output, the trimming circuit including a termination resistor coupled in parallel with at least one trimming resistor; and
- providing a first switch coupled to the termination resistor in series, and a second switch coupled to the at least one trimming resistor in series, such that a ratio of a resistance of the first switch to a resistance of the second switch approximately equals a ratio of a resistance of the termination resistor to a resistance of the trimming resistor,
- wherein the amplifier output is connected back to the negative input through the first switch,
- wherein the first switch includes two ends, one end connected to the amplifier output, and another end connected to a feedback circuit, and wherein the first switch is always in a conducting state.

17. The method of claim 16 further comprising keeping the first switch in a conducting state.

18. The method of claim 16, wherein a total resistance of the trimming circuit approximately equals a parallel resistance of the termination resistor and the trimming resistor.

* * * * *